(12) United States Patent
Teterud et al.

(10) Patent No.: US 6,373,298 B1
(45) Date of Patent: Apr. 16, 2002

(54) ENHANCED VOLTAGE DRIVE CIRCUIT FOR HDD WRITE DRIVER

(75) Inventors: Patrick Teterud, Plano; Thomas Van Eaton, Wylie, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/772,770

(22) Filed: Jan. 30, 2001

(51) Int. Cl.$^7$ .................. H03K 3/00; H03K 17/56
(52) U.S. Cl. .............. 327/110; 327/423; 327/588
(58) Field of Search ............... 327/110, 423, 327/424, 588

(56) References Cited

U.S. PATENT DOCUMENTS

| | | | |
|---|---|---|---|
| 5,550,502 A | * | 8/1996 | Aranovsky ............... 327/423 |
| 5,880,626 A | * | 3/1999 | Dean ...................... 327/110 |
| 6,121,800 A | * | 9/2000 | Leighton et al. ......... 327/423 |
| 6,256,269 B1 | * | 6/2001 | Schuler et al. ........... 327/110 |

* cited by examiner

Primary Examiner—Toan Tran
(74) Attorney, Agent, or Firm—W. Daniel Swayze, Jr; W. James Brady; Frederick J. Telecky, Jr.

(57) ABSTRACT

A HDD write driver circuit (30) having two sets of boost devices ($Q_1$, $M_2$, and $Q_2$, $M_1$) which are temporarily turned on during a current reversal to boost the normal current and increase the differential transient voltage across the coil (LS) while decreasing the TRTF. During a current reversal cycle, one set of transistors is turned on while the other set is left off. The on set to pulls the node at one end of the coil substantially to the positive rail, and pulls the other node at the other end of the coil substantially to the lower rail ($V_{ee}$). The boost FETs ($M_1$, $M_2$) are preferably large PMOS devices that must be driven hard to achieve a quick transient switching time. Advantageously, when one of the PMOS FETs ($M_1$, $M_2$) are on, the associated series resistor (RS) is bypassed. The voltage at nodes HX and HY are no longer limited by an IR voltage drop associated with a resister (RS) therefore increasing the differential transient voltage across nodes HX and HY by increasing the maximum transient voltage of the pull-up node. Preferably, each node (HX, HY) of the coil (LS) can be pulled to within 0.2 volts of the positive rail.

24 Claims, 5 Drawing Sheets

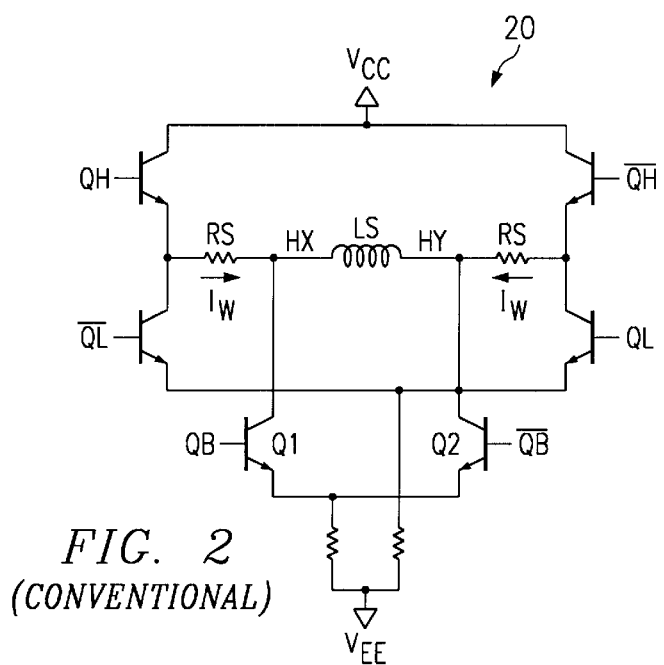
FIG. 2
(CONVENTIONAL)

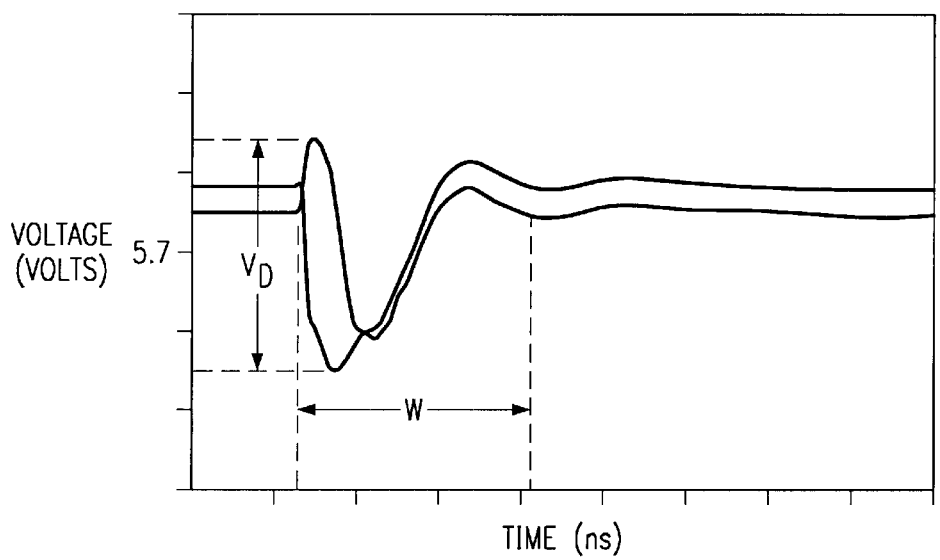
FIG. 4
(CONVENTIONAL)

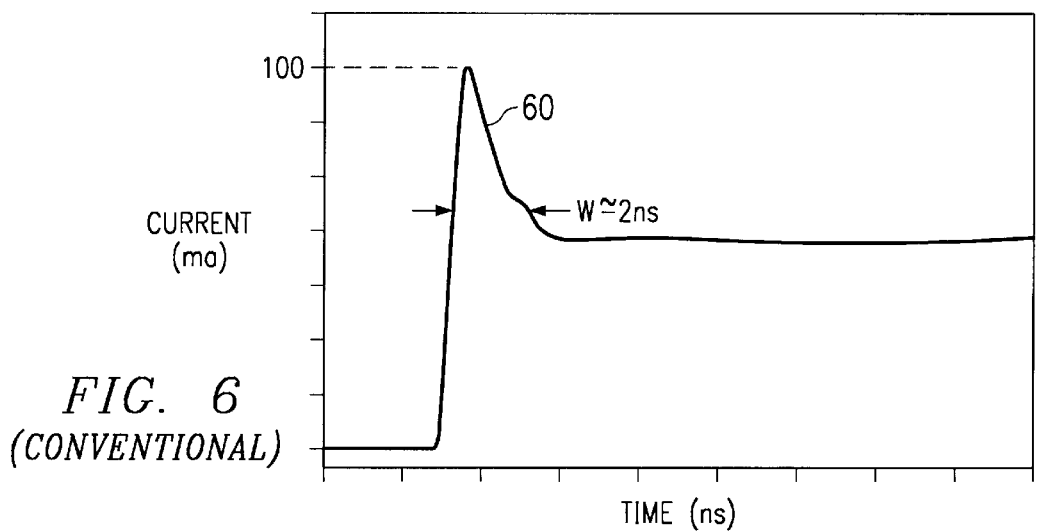
FIG. 6
(CONVENTIONAL)

ENHANCED VOLTAGE DRIVE CIRCUIT FOR HDD WRITE DRIVER

CROSS REFERENCE TO RELATED APPLICATIONS

Cross reference is made to commonly assigned U.S. patent application Ser. No. 09/772,776 entitled "Ultra Fast Voltage Drive," filed herewith and the teachings incorporated herein by reference.

FIELD OF THE INVENTION

The present invention is generally related to mass media drive controllers, including HDD drives, and more particularly to a write drive control circuit controlling the head of the drive.

BACKGROUND OF THE INVENTION

The coil current waveform characteristics that are important in a HDD voltage write driver circuit is depicted at 10 in FIG. 1. In particular, the current rise time, overshoot amount and duration, undershoot, and settling time are of particular interest. Desired characteristics for the coil current waveform is a fast rise time and settling time, a controllable amounts of overshoot, and very little undershoot. By achieving these characteristics, a hard disk drive storage capacity can be improved.

A conventional voltage source based write coil driver circuit is shown at 20 in FIG. 2. A coil is modeled as LS, and is connected to four transistors via coil node HX and node HY. The connection of the four transistors to the coil is known conventionally as an H-bridge. The H-bridge controls the direction of the coil current $I_w$, by raising the voltage on one node (HY or HX), this voltage level is referred to as the high side voltage, and lowering the voltage on the other node, this voltage level is referred to as the low side voltage. The current direction can be changed by raising the low side voltage to the level required to become the high side voltage and lowering the high side voltage to level required for it to become the low side voltage. Changing the direction of the coil current $I_w$ changes the magnetic flux through the coil.

One limitation of this conventional voltage source based write coil driver 20 is the maximum differential transient voltage generated at nodes HX and HY, during a current reversal. This limitation can be appreciated in conventional circuit 20 shown in FIG. 2, whereby the voltage of the low side voltage node can be momentarily pulled down, such as node HX, to near the second voltage rail $V_{ee}$ using transistor $Q_1$. However, during this same time there is no circuit to pull up the high side voltage node HY. Thus, the voltage at each node can go no higher than that expressed by the following equation:

$$V_{node}=V_{cc}-(V_{be}+RS\times I_w).$$

Assuming the coil current $I_w$ has a nominal current of about 40 milliamps. It is controlled by signals QL, $\overline{QL}$, QH, $\overline{QH}$, QB and $\overline{QB}$. FIG. 8 shows the voltage levels for all four signals for a current transition with current initially flowing through the coil from node HX to node HY and then reversing and flowing from node HY into node HX. These signals are not complements in the strict sense but they are in the sense that the voltage levels for a current transition in the opposite direction can be accurately represented by the same wave forms but swapping the names, QL for $\overline{QL}$, QH for $\overline{QH}$, and QB for $\overline{QB}$. As is shown in FIG. 8 during current reversal of the coil, transistors $Q_1$ or $Q_2$ are temporarily turned on using signals QB and $\overline{QB}$ to "boost" normal current and increase the differential voltage, decreasing the rise time and fall time commonly referred to as (TRTF). It can be appreciated that when voltage level of HX is transitioned from the high side voltage level to the low side voltage level, commonly referred to as pulled down, transistor $Q_1$ will momentarily turn on and bypass half of the matched impedance resistors RS. During this "boost," however, HY is transitioning from the low side voltage level to the high side voltage level or pulled up. The series resistor RS connected to node HY is still in the current path. Thus, the above equation represents the maximum pull up voltage on node HY when the node HX is pulled down close to $V_{ee}$. Conversely if HX was being pulled up it could only achieve the maximum voltage level of the above equation where $Q_2$ would momentarily turn on and bypass half of the matched impedance resistors RS allowing HY to be pulled down close to $V_{ee}$. Conventionally, the maximum pull up voltage at either node is approximately 2.7 volts below the positive voltage rail $V_{cc}$.

There is desired an improved write coil driver circuit that improves the maximum differential transient voltage across nodes HX and HY during a current reversal of the coil, decreasing TRTF, and reducing the width of the overshoot to achieve faster write data rates. This can be achieved by providing a high side voltage boost that bypasses the matched impedance resistors RS during the pull up. This boost is realized by including a "high side" drive using large PMOS FETs one connected between HX and VCC and the other connected between HY and VCC, 32 in FIG. 3.

SUMMARY OF THE INVENTION

The present invention achieves technical advantages as an enhanced voltage drive circuit for a HDD write driver by providing circuitry that pulls up the voltage at one end of the coil to approximately $V_{cc}$ effectively bypassing the associated series resistor RS. During a current reversal, the high side boost devices preferably PMOS FETs, significantly improve the maximum differential transient voltage at nodes HX and HY. This increased voltage decreases the TRTF and has the potential to greatly increase the overshoot with out increasing the overshoot pulse width or the settling time thereby obtaining a faster data rate.

BRIEF DESCRIPTION OF THE DRAWINGS

FIG. 2 is a schematic diagram of a conventional voltage source based write control driver circuit;

FIG. 4 is a waveform diagram depicting the conventional pull up and pull down voltage waveforms at nodes HX or HY during a current reversal, illustrating a moderate peak voltage and width of the transient;

FIG. 6 illustrates a current waveform through the coil for the conventional circuit of FIG. 2;

DETAILED DESCRIPTION OF THE PREFERRED EMBODIMENT

Figure 1:
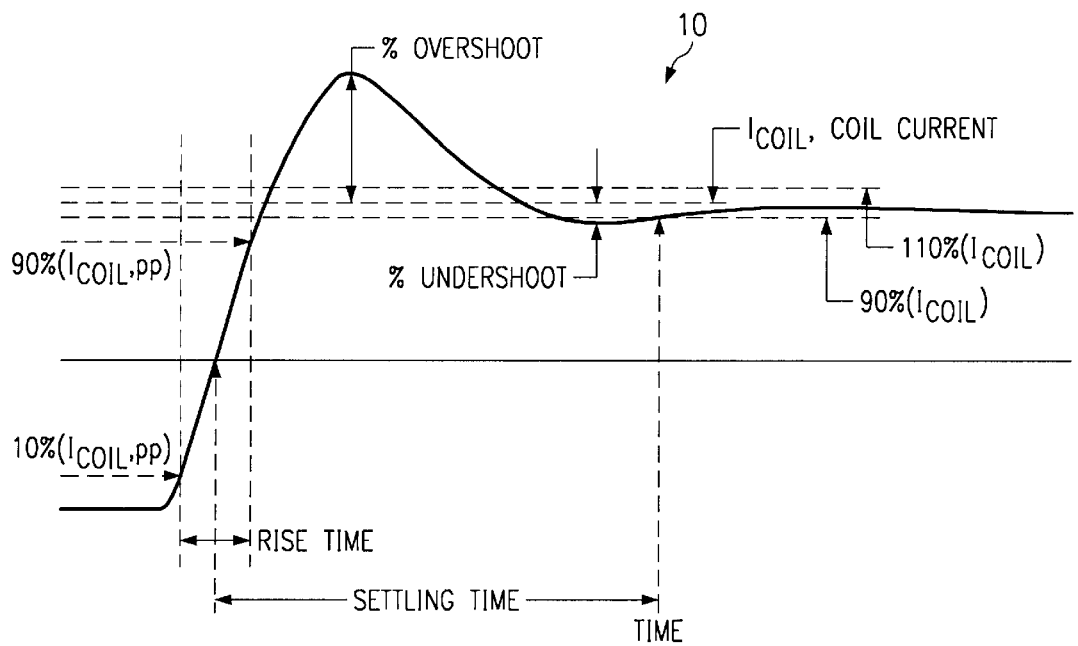
FIG. 1 illustrates the important current characteristics of a coil current waveform for a write coil driver.
Figure 3:
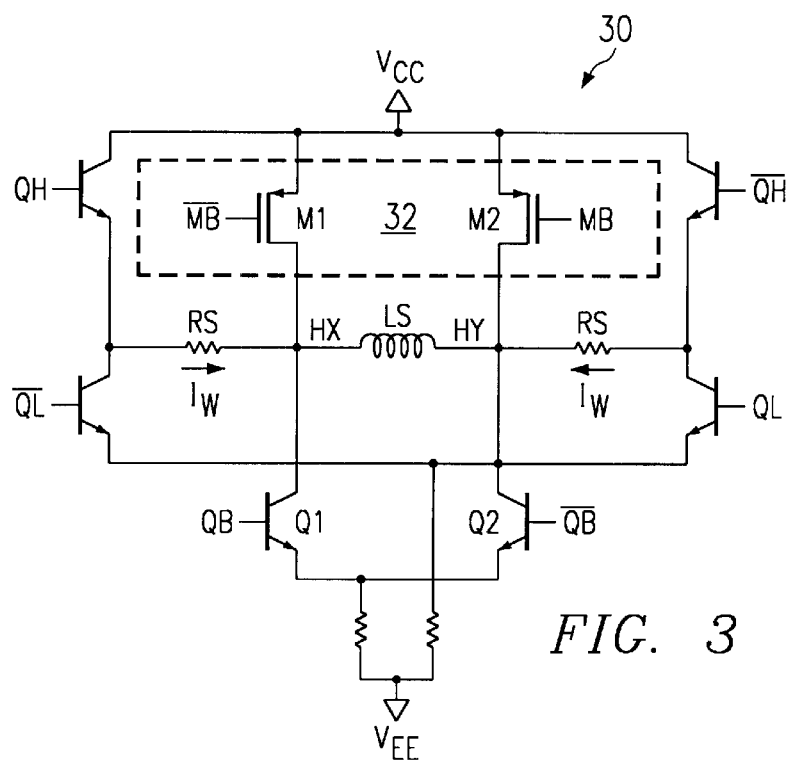
FIG. 3 is a schematic diagram of the present invention comprising a voltage based write coil driver including two FETs, one connected between the positive rail $V_{cc}$ and each of the nodes HX and HY.
Figure 9A:
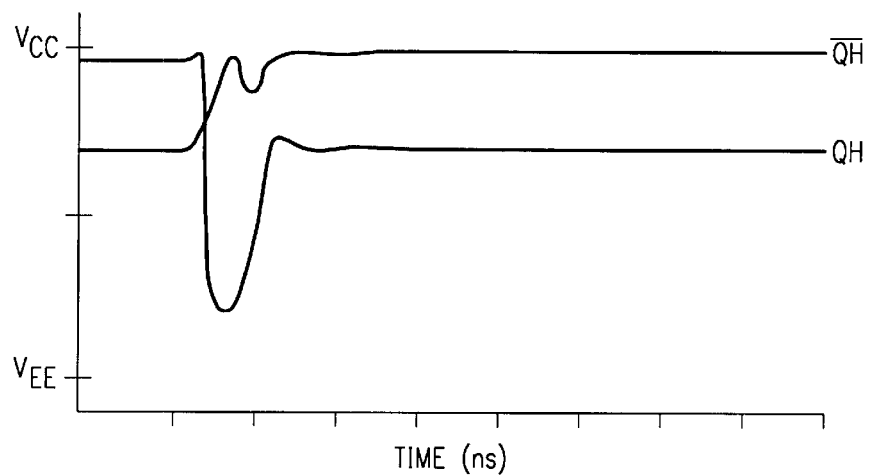
FIG. 9 illustrates signal waveforms for the circuit of FIG. 3.
Figure 9B:
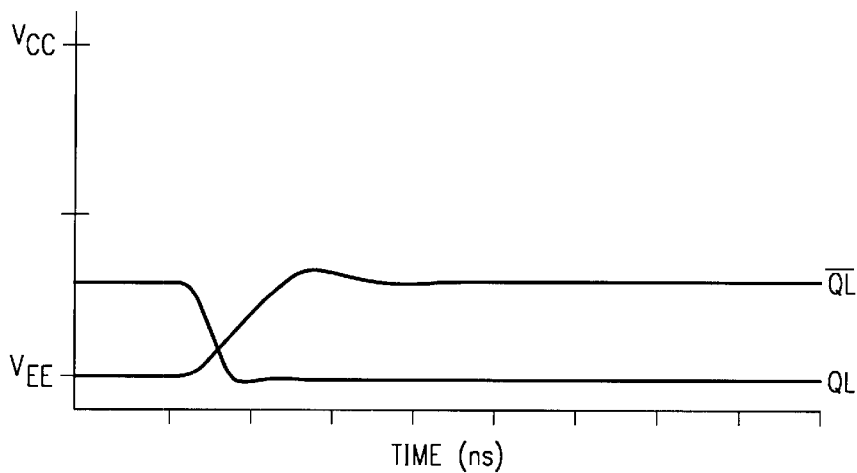
Figure 9C:
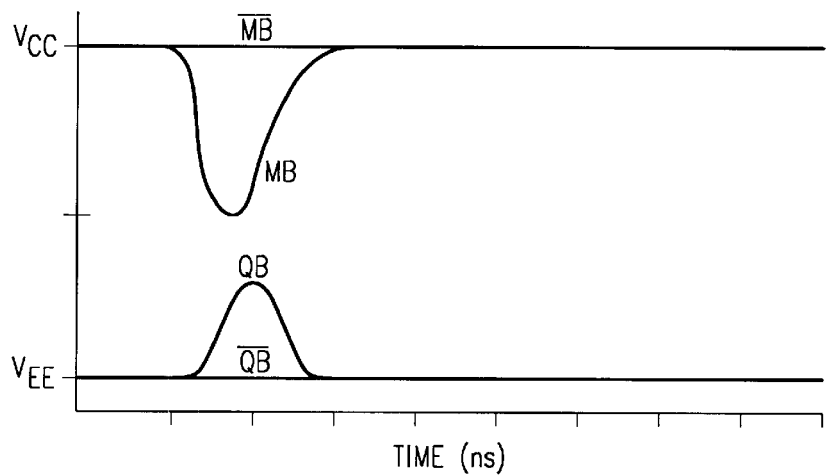

Referring now to FIG. 3, there is depicted generally 30 a HDD write driver circuit. Circuit 30 is seen to include the basic elements of the conventional H-bridge circuit 20 illustrated in FIG. 2, and advantageously also includes a pair of large PMOS FETs that generally shown at 32 each being selectively switched in conjunction with a respective transistor $Q_1$ and $Q_2$. The control signals are shown on FIG. 9. When on, FETs 32 advantageously pull-up the voltage at the respective side of the coil LS up to substantially $V_{cc}$, and thus effectively bypass the associated and proximate resistor RS. PMOS FETs are preferably used instead of NMOS FETs since PMOS FETs have a smaller drain-to-source "on-resistance," and hence, include a smaller drain-to-source voltage drop. However, the use of NMOS FETs is within the scope of the present invention.

During a current reversal cycle, two boost devices will now be on temporarily, either transistor $Q_1$ and $M_2$, or, transistor $Q_2$ and $M_1$, depending on which way the inductor current is to be steered. The maximum differential voltage that can be achieved is increased by more then 2 volts over the conventional write driver due to the addition of these PMOS FETs 32. The increased maximum differential voltage during the current reversal cycle will decrease the TRTF of the coil current and allows for a much higher overshoot to be generated. The minimum width of the overshoot is directly related to the TRTF and inversely related to the height of the overshoot. Therefor holding the overshoot constant would result in a decrease in the minimum width of the overshoot. This ability to have more overshoot for a given overshoot width then the conventional design is essential to achieving faster data rates.

Figure 5:
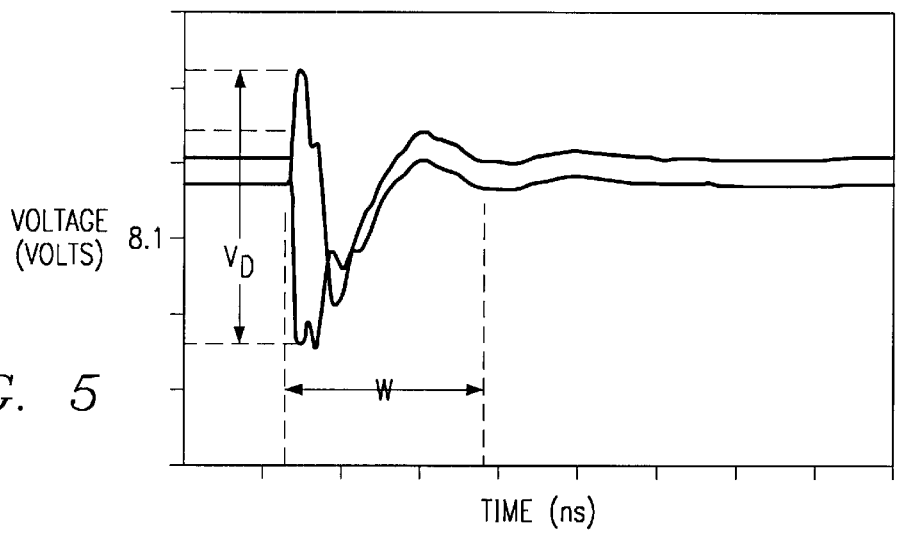
FIG. 5 is a waveform diagram depicting improved pull up and pull down voltage waveforms at node HX and HY for the circuit of the present invention shown in FIG. 3, illustrating an improved peak voltage and narrowed transient.

FIG. 4 and FIG. 5 depict voltage waveforms at the nodes HX and HY shown as waveforms 40 and 50, illustrating several advantages of implementing the additional PMOS FET devices 32, including an increased pull up voltage over that shown in FIG. 2, thus producing an increased differential voltage $V_D$ across the coil, and a narrowed width $W_y$ for the overall transient as depicted.

In a first instance when transistor $Q_1$ is turned on by corresponding signal QB to responsively pull-down the voltage at node HX to approximately $V_{ee}$, the associated PMOS FET $M_2$ is also turned on to pull-up the voltage at node HY to substantially $V_{cc}$. During this cycle, transistors $Q_2$ and $M_1$ are off.

At the next current reversal, conversely, transistors M1 and Q2 are in the on-state such that node HX is pulled substantially to $V_{cc}$, with a small drop of only about 0.2 volts being that across the drain-to-source terminals of PMOS FET M1. At the same time, node HY is pulled low to substantially $V_{ee}$ by the transistor Q2. The voltage across PMOS FET is inversely related to its size. A larger PMOS device will have a smaller voltage drop. The maximum size of the device is limited by the circuit used to switch it. Without improvements to the driving circuit such as the "Ultra Fast Voltage Drive" a large PMOS FET could not be switched fast enough.

A previously mentioned regarding the conventional circuit shown in FIG. 2 at 20, conventionally, the highest voltage that nodes HX or HY could obtain was defined by the equation $V_{cc}-(V_{be}+RS\times I_w)$, whereby $I_w$ is nominally set around 40 milliamps which equates to about $V_{cc}-2.7$ volts. The present invention achieves technical advantages in that the voltage drop across the associated resistor RS is eliminated and the voltage at nodes HX and HY when pulled up can be very near $V_{cc}$ depending on the size of the PMOS FET used. The improvement increases the differential voltage $V_D$ across the coil. A voltage drop across the properly sized PMOS FET is typically no more than about 0.2 volts. To achieve this the FETs M1 and M2 are large PMOS FETs that are driven hard by ultra fast rail-to-rail voltage drive circuit described in the cross-referenced commonly assigned U.S. Pat. No. 09/772,776 "Ultra Fast Voltage Drive Circuit," the teachings of which are incorporated herein by reference. This circuit shown in the cross-referenced application quickly drives the large PMOS FET devices $M_1$ and $M_2$ with a maximum voltage swing on the Gate to minimize the voltage drop across the FET.

Figure 7:
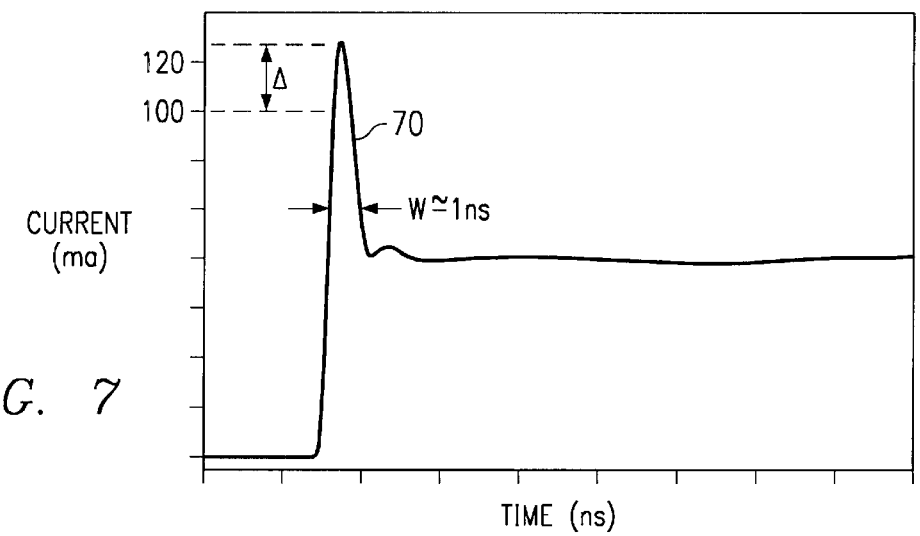
FIG. 7 is a waveform diagram depicting the current waveforms through the coil for the present invention shown in FIG. 3, illustrating increased peak current and a reduced transient width.
Figure 8A:
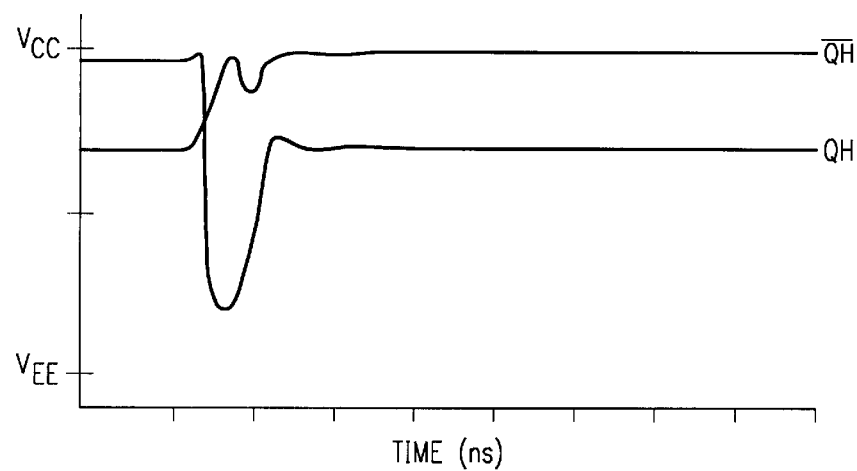
FIG. 8 illustrates signal waveforms for the circuit of FIG. 2.
Figure 8B:
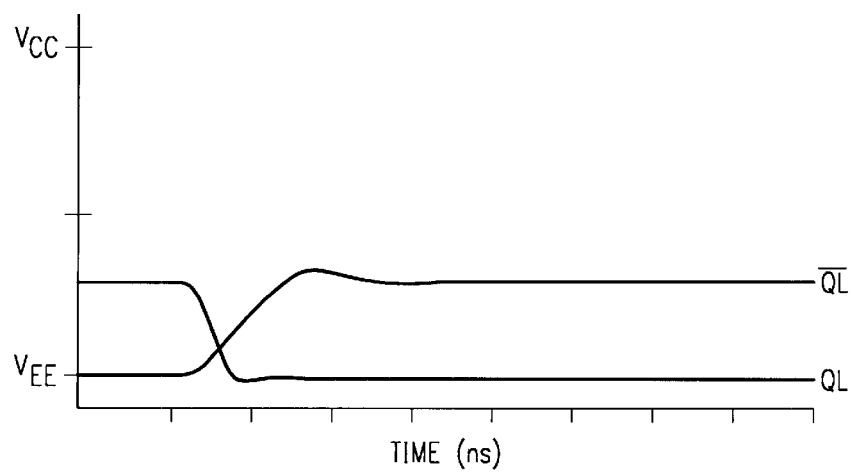
Figure 8C:
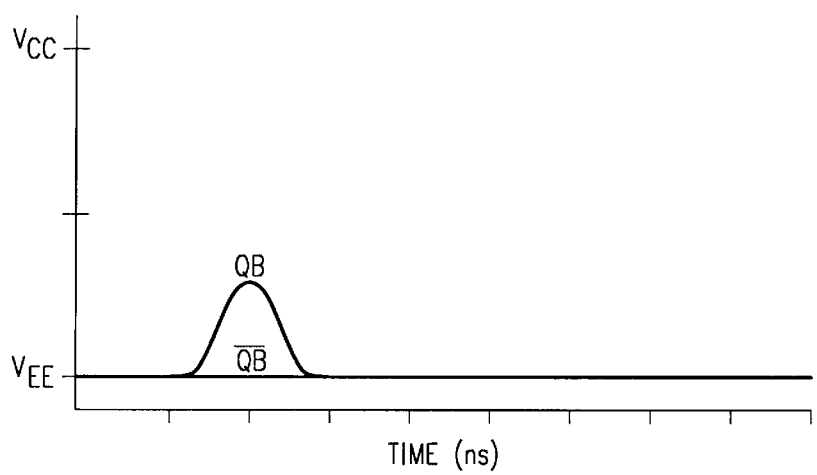

Referring now to FIG. 6 and FIG. 7, there is depicted the coil current waveform $I_w$ for the conventional circuit showing FIG. 6, depicted as waveform 60 and at 70 according to the present invention comprising circuit 30 as shown in FIG. 3. The differential voltage waveforms 40 at node HX and HY of conventional circuit 20 are shown in FIG. 4, compared with the differential voltage waveforms shown at 50 in FIG. 5, depicting the advantage of the present invention. As shown in FIG. 7, the peak current of the coil current waveform is substantially improved, due to the improved voltage range of HX and HY FIG. 5. The width of the transient is substantially narrowed as shown at Wc.

In summary, the present invention shown as circuit 30 meets the objectives of a desired HDD write driver circuit in that it has a fast current reversal, a maximum pull up voltage and an increased differential voltage across the coil. It also shows increased overshoot and controlled undershoot, with a narrower overshoot width. The properly sized additional PMOS FETs $M_1$ and $M_2$ occupy nominal silicon space on a die, and the gate can be driven with the "ultra-fast rail-to-rail voltage drive circuit." to achieve quick switching time.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A write coil driver circuit, comprising:
   a first voltage rail and a second voltage rail;
   an H-bridge drive circuit having a first and second transistor coupled together at a first node, and a third and fourth transistor coupled together at a second node;
   a coil;
   a first resistor coupled between said first node and a third node defined at one end of said coil, and a second resistor coupled between said second node and a fourth node defined at the other end of said coil; and
   a drive circuit coupled to said third node and said fourth node selectively pulling said third node and said fourth node to substantially said first voltage rail;
   wherein said first and third transistors are connected to said first voltage rail and said second and fourth transistors are connected to said second voltage rail.

2. The driver circuit of claim 1 wherein said drive circuit further comprises a fifth transistor coupled between said third node and said second voltage rail and a sixth transistor coupled between said fourth node and said second voltage rail.

3. The drive circuit of claim 2 wherein said drive circuit drives said third node as a function of operation of said sixth transistor, and driving said fourth node as a function of operation of said fifth transistor.

4. The drive circuit of claim 3 wherein said drive circuit drives said third node while said sixth transistor is driven, and drives said fourth node while said fifth transistor is driven.

5. The drive circuit of claim 1 wherein said third node and said fourth node are selectively pulled to within 0.2 volts of said first voltage rail.

6. The drive circuit of claim 1 wherein said drive circuit comprises a first FET coupled between said first voltage rail and said third node, and a second FET coupled between said first voltage rail and said fourth node.

7. The drive circuit of claim 6 wherein said first FET is momentarily driven during a current reversal of said coil.

8. The drive circuit of claim 6 wherein said first FET and said second FET are PMOS devices.

9. The drive circuit of claim 6 wherein said first resistor does not pull-down a voltage at said third node when said first FET is driven.

10. The drive circuit of claim 9 wherein said second resistor does not pull-down a voltage at said fourth node when said second FET is driven.

11. The drive circuit of claim 6 wherein said first FET bypasses said first resistor during a current reversal of said coil, and said second FET bypasses said second resistor during a current reversal of said coil.

12. The drive circuit of claim 6 wherein said first voltage rail is a positive with respect to said second rail.

13. A write coil driver circuit, comprising:

a first voltage rail and a second voltage rail;

an H-bridge drive circuit having a first and second transistor coupled together at a first node, and a third and fourth transistor coupled together at a second node;

a coil;

a first resistor coupled between said first node and a third node defined at one end of said coil, and a second resistor coupled between said second node and a fourth node defined at the other end of said coil; and a drive circuit coupled to said third node and said fourth node increasing a differential voltage generated across said coil during current reversal of said coil;

wherein said first and third transistors are connected to said first voltage rail and said second and fourth transistors are connected to said second voltage rail.

14. The driver circuit of claim 13 wherein said drive circuit further comprises a fifth transistor coupled between said third node and said second voltage rail and a sixth transistor coupled between said fourth node and said second voltage rail.

15. The drive circuit of claim 14 wherein said drive circuit drives said third node as a function of operation of said sixth transistor, and driving said fourth node as a function of operation of said fifth transistor.

16. The drive circuit of claim 15 wherein said drive circuit drives said third node while said sixth transistor is driven, and drives said fourth node while said fifth transistor is driven.

17. The drive circuit of claim 13 wherein said third node and said fourth node are selectively pulled to within 0.2 volts of said first voltage rail.

18. The drive circuit of claim 13 wherein said drive circuit comprises a first FET coupled between said first voltage rail and said third node, and a second FET coupled between said first voltage rail and said fourth node.

19. The drive circuit of claim 18 wherein said first FET is momentarily driven during a current reversal of said coil.

20. The drive circuit of claim 18 wherein said first FET and said second FET are PMOS devices.

21. The drive circuit of claim 18 wherein said first resistor does not pull-down a voltage at said third node when said first FET is driven.

22. The drive circuit of claim 21 wherein said second resistor does not pull-down a voltage at said fourth node when said second FET is driven.

23. The drive circuit of claim 18 wherein said first FET bypasses said first resistor during a current reversal of said coil, and said second FET bypasses said second resistor during a current reversal of said coil.

24. The drive circuit of claim 18 wherein said first voltage rail is a positive with respect to said second rail.

* * * * *